US012677501B2

(12) United States Patent (10) Patent No.: US 12,677,501 B2
Sawada (45) Date of Patent: Jul. 7, 2026

(54) METHOD FOR CONNECTING SOLAR CELL STRING

(71) Applicant: KANEKA CORPORATION, Osaka (JP)

(72) Inventor: Toru Sawada, Osaka (JP)

(73) Assignee: KANEKA CORPORATION, Osaka (JP)

( * ) Notice: Subject to any disclaimer, the term of this patent is extended or adjusted under 35 U.S.C. 154(b) by 416 days.

(21) Appl. No.: 18/551,395

(22) PCT Filed: Mar. 30, 2022

(86) PCT No.: PCT/JP2022/016020
§ 371 (c)(1),
(2) Date: Sep. 19, 2023

(87) PCT Pub. No.: WO2022/210886
PCT Pub. Date: Oct. 6, 2022

(65) Prior Publication Data
US 2025/0072158 A1 Feb. 27, 2025

(30) Foreign Application Priority Data
Mar. 31, 2021 (JP) ................................. 2021-060048

(51) Int. Cl.
*H10F 77/20* (2025.01)
*H10F 19/80* (2025.01)
*H10F 71/00* (2025.01)
(52) U.S. Cl.
CPC ......... *H10F 71/137* (2025.01); *H10F 19/804* (2025.01); *H10F 77/211* (2025.01)
(58) Field of Classification Search
CPC .......... H10F 19/35; H10F 19/33; H10F 19/40; H10F 19/80; H10F 19/90; H10F 19/902;
(Continued)

(56) References Cited

U.S. PATENT DOCUMENTS

2004/0191422 A1* 9/2004 Kataoka .................. H10F 19/31
427/553
2015/0349703 A1* 12/2015 Morad .................... H02S 20/25
136/251
(Continued)

FOREIGN PATENT DOCUMENTS

CN 104919597 A * 9/2015 ............. H02S 40/36
CN 109326665 A 2/2019
(Continued)

OTHER PUBLICATIONS

English machine translation of Morad et al. (CN 104919597) published Sep. 16, 2015.*

(Continued)

*Primary Examiner* — Christina Chern
(74) *Attorney, Agent, or Firm* — Studebaker Brackett PLLC

(57) ABSTRACT

A method includes: a first collector electrodes forming step P1; a second collector electrodes forming step P2 of forming a plurality of second collector electrodes by applying a pasty second collector electrode material; a dividing guidelines forming step P3 of forming on the solar cell a plurality of dividing guidelines, each of which is formed between each two adjacent first collector electrodes and between each two adjacent second collector electrodes; a dividing step P4 of cutting the solar cell along the plurality of dividing guidelines to divide the solar cell into the plurality of small cell pieces; an overlapping step P5 of overlapping the plurality of small cell pieces so as to bring the first collector electrodes and the second collector electrodes cell pieces into abutting contact with each other; and a curing step P6 of curing the second collector electrode material.

7 Claims, 6 Drawing Sheets

(58) Field of Classification Search
CPC .. H10F 19/906; H10F 71/136; H10F 71/1375;
H10F 71/137; H10F 77/935; H10F
77/937
See application file for complete search history.

(56) References Cited

U.S. PATENT DOCUMENTS

| | | | |
|---|---|---|---|
| 2017/0179320 A1 | 6/2017 | Erben | |
| 2018/0366596 A1 | 12/2018 | Chang et al. | |

FOREIGN PATENT DOCUMENTS

| | | |
|---|---|---|
| JP | 2019-004135 A | 1/2019 |
| WO | 2015/152020 A1 | 10/2015 |
| WO | 2019/189267 A1 | 10/2019 |
| WO | 2021/020657 A1 | 2/2021 |

OTHER PUBLICATIONS

International Search Report issued in PCT/JP2022/016020; mailed Jun. 21, 2022.
International Preliminary Report On Patentability (Chapter I) and Written Opinion issued in PCT/JP2022/016020; mailed Oct. 12, 2023.

* cited by examiner

2

1

METHOD FOR CONNECTING SOLAR CELL STRING

CROSS-REFERENCE TO RELATED APPLICATION

This application claims priority to Japanese Patent Application No. 2021-060048, the disclosure of which is incorporated herein by reference in its entirety.

FIELD

The present invention relates to a method for connecting a solar cell string in which a plurality of solar cells are electrically connected to each other.

BACKGROUND

A solar cell generally has a substantially rectangular plane shape. When the solar cells are connected to each other, a collector electrode extending in a long-side direction of each of the solar cells is applied to a light-receiving surface of the solar cell at a position close to one end in a short-side direction thereof, followed by being cured; and a rear surface electrode extending in the long-side direction is applied to a rear surface of the solar cell opposite to the light-receiving surface at a position close to the other end in the short-side direction, followed by being cured. Thereafter, one solar cell is overlapped with another solar cell so as to have a conductive member present between the rear surface electrode of the one solar cell and the collector electrode of the other solar cell. The overlapped solar cells are subjected to pressure and heating to bring the rear-surface electrode of the one solar cell and the collector electrode of the other solar cell into contact with the conductive member for their electrical connection, thereby completing the connection of the solar cells (see, for example, Patent Literature 1).

CITATION LIST

Patent Literature

Patent Literature 1: WO 2015/152020 A

SUMMARY

Technical Problem

The method of Patent Literature 1 in which the rear surface electrode and the collector electrode are connected to each other using the conductive member is more excellent in productivity than the case where those electrodes are connected using a tab wire, but a method further excellent in productivity has been demanded.

In view of the above circumstances, it is therefore an object of the present invention to provide a method for connecting a solar cell string excellent in productivity and a solar cell string obtained by the connecting method.

Solution to Problem

A method for connecting a solar cell string according to the present invention includes: a first collector electrodes forming step of forming a plurality of first collector electrodes on one surface of a solar cell; a second collector electrodes forming step of forming a plurality of second collector electrodes by applying a pasty second collector electrode material including a metal component and a synthetic resin component to portions of an other surface of the solar cell so as to be opposed to the respective ones of the plurality of first collector electrodes; a dividing guidelines forming step of forming a plurality of dividing guidelines on the solar cell to allow the solar cell to be easily divided into a plurality of small cell pieces, in which each of the plurality of dividing guidelines is formed between each two adjacent ones of the plurality of first collector electrodes formed on the one surface and between each two adjacent ones of the plurality of second collector electrodes formed on the other surface; a dividing step of cutting the solar cell along the plurality of dividing guidelines to dividing the solar cell into the plurality of small cell pieces each having each of the plurality of first collector electrodes and each of the plurality of the second collector electrodes; an overlapping step of overlapping the plurality of small cell pieces so as to bring the first collector electrode of one of the plurality of small cell pieces and the second collector electrode of another one of the plurality of small cell pieces into abutting contact with each other; and a curing step of curing the pasty second collector electrode material after the plurality of small cell pieces are made to overlap.

The method for connecting the solar cell string can be configured such that the solar cell has a substantially quadrangular shape, the plurality of dividing guidelines are grooves substantially parallel to a pair of opposed sides of the solar cell, the plurality of first collector electrodes and the plurality of second collector electrodes each include a bus bar electrode, the first collector electrodes forming step includes a step of forming the bus bar electrode of each of the plurality of first collector electrodes at a position close to one of the pair of opposed sides of one surface of each of the plurality of small cell pieces to be divided, the second collector electrodes forming step includes a step of forming the bus bar electrode of each of the plurality of second collector electrodes at a position close to another one of the pair of opposed sides of an other surface of each of the plurality of small cell pieces, and the overlapping step is a step of bringing the bus bar electrode of each of the plurality of first collector electrodes and the bus bar electrode of each of the plurality of second collector electrodes into overlapping each other.

The method for connecting the solar cell string can be configured such that the synthetic resin component of the second collector electrode material includes, as a main component, an acrylic resin or a silicone resin.

The method for connecting the solar cell string can further include a step of attaching a transparent synthetic resin to the plurality of overlapped small cell pieces so as to extend over the plurality of small cell pieces, before curing the second collector electrode material.

DESCRIPTION OF EMBODIMENTS

Hereinafter, a method for connecting a solar cell string according to one embodiment of the present invention is described with reference to the drawings.

Figures 2A, 2B:
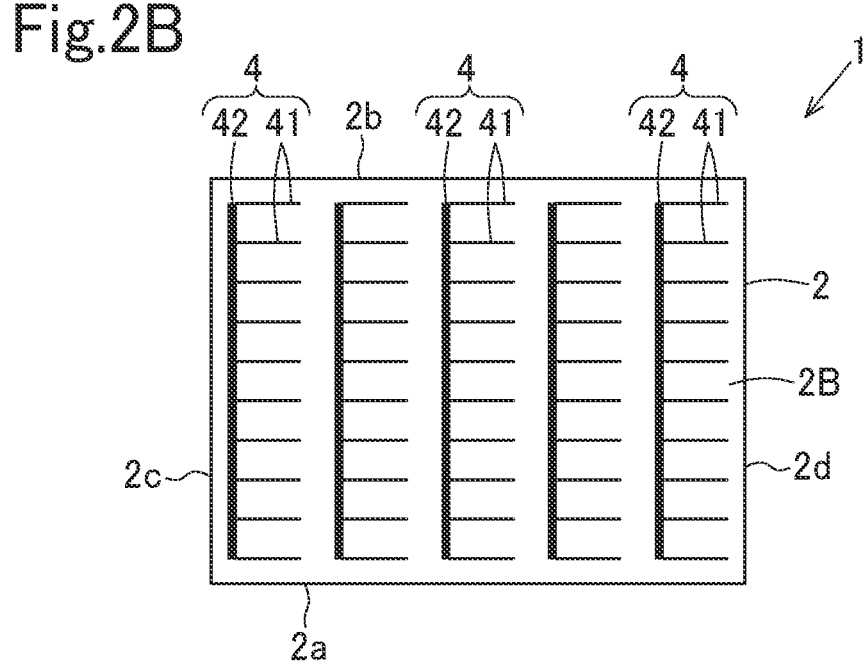
FIG. 2A is a bottom view of the semiconductor substrate of FIG. 1B.
FIG. 2B is a bottom view of a solar cell configured to have collector electrodes formed on another surface of the semiconductor substrate of FIG. 2A.

A solar cell 1 of this embodiment includes: a semiconductor substrate 2 having a substantially quadrangular shape; front-side collector electrodes 3 which are a plurality of first collector electrodes formed on a front surface 2A as one surface of the semiconductor substrate 2; and back-side collector electrodes 4 which are a plurality of second collector electrodes formed on a back surface 2B as the other surface of the semiconductor substrate 2 (see FIG. 2B). As will be described later, the solar cell 1 is divided into a plurality of (five in FIG. 3B) small cell pieces 11 to 15, and the plurality of small cell pieces 11 to 15 are interconnected with each other by shingling to form a solar cell string 5 (see FIG. 4A). The solar cell 1 has a plate shape, and for example, has a substantially quadrangular plate shape.

The semiconductor substrate 2 is formed of a thin slice in a transverse direction of a silicon single crystal ingot. In this embodiment, the semiconductor substrate 2 is formed to have a substantially quadrangular shape (square shape or rectangular shape), but can have a different shape from these shapes. A description will be hereinafter made with a right and a left defined based on a right-left direction of the paper surface in each of FIG. 1A to FIG. 3B, and a top and a bottom defined based on a top-bottom direction thereof.

Figure 1A:
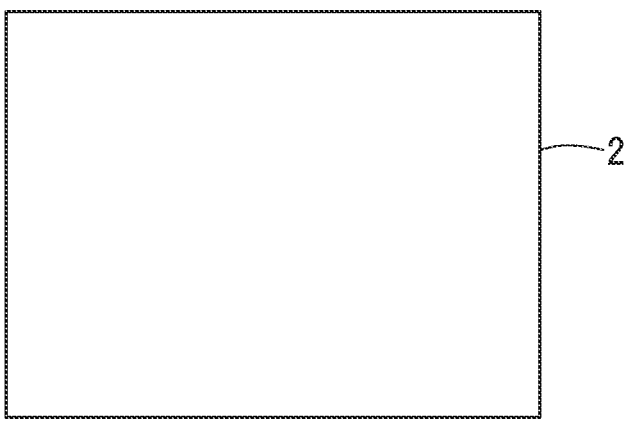
FIG. 1A is a plan view of a semiconductor substrate.
Figure 1B:
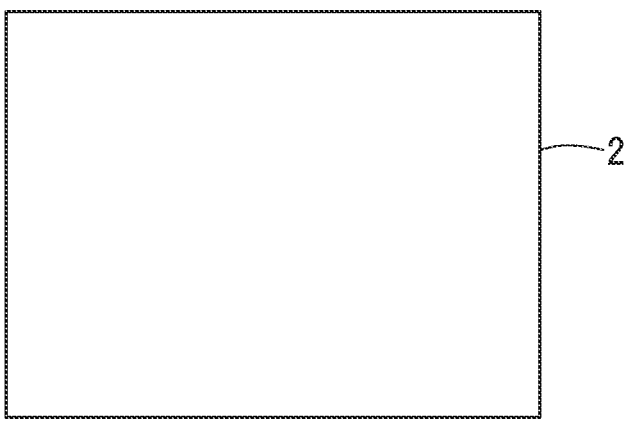
FIG. 1B is a plan view of the semiconductor substrate of FIG. 1A with its one surface having collector electrodes formed thereon.

The front-side collector electrodes 3 are formed respectively within segments obtained by dividing the front surface 2A of the semiconductor substrate 2 into five equal parts in the right-left direction, and each of the front-side collector electrodes 3 includes, as shown in FIG. 1B, a plurality of (10 in the figure) front-side finger electrodes 31, and a front-side bus bar electrode 32 having a larger width than each of the front-side finger electrodes 31 and configured to collect electric current collected by the plurality of front-side finger electrodes 31. The width of each of the front-side finger electrodes 31 or the width of the front-side bus bar electrode 32 refers to a dimension in a direction orthogonal to a direction in which the electrode extends. The plurality of front-side finger electrodes 31 each have a linear shape parallel to two sides 2a and 2b opposed to each other out of the four sides of the semiconductor substrate 2, and are formed at intervals from each other in a direction along the remaining two sides 2c and 2d. The front-side bus bar electrode 32 extends in a direction substantially orthogonal to the front-side finger electrodes 31 so as to connect one same ends (i.e., right ends on a side of one side 2d) in a longitudinal direction of the plurality of front-side finger electrodes 31.

The back-side collector electrodes 4 are formed respectively within segments obtained by dividing the back surface 2B of the semiconductor substrate 2 into five equal parts in the right-left direction, and each of the back-side collector electrodes 4 includes, as shown in FIG. 2B, a plurality of (10 in the figure) back-side finger electrodes 41, and a back-side bus bar electrode 42 having a larger width than each of the back-side finger electrodes 41 and configured to collect electric current collected by the plurality of back-side finger electrodes 41. The width of each of the back-side finger electrodes 41 or the width of the back-side bus bar electrode 42 refers to a dimension in a direction orthogonal to a direction in which the electrode extends. The plurality of back-side finger electrodes 41 each have a linear shape parallel to the two sides 2a and 2b opposed to each other out of the four sides of the semiconductor substrate 2, and are formed at intervals from each other in the direction along the remaining two sides 2c and 2d. The back-side bus bar electrode 42 extends in a direction substantially orthogonal to the back-side finger electrodes 41 so as to connect one same ends (i.e., left ends on the side opposite to the side for the front-side bus bar electrode 32; on a side of the other side 2c) in a longitudinal direction of the plurality of back-side finger electrodes 41.

Figure 4A:
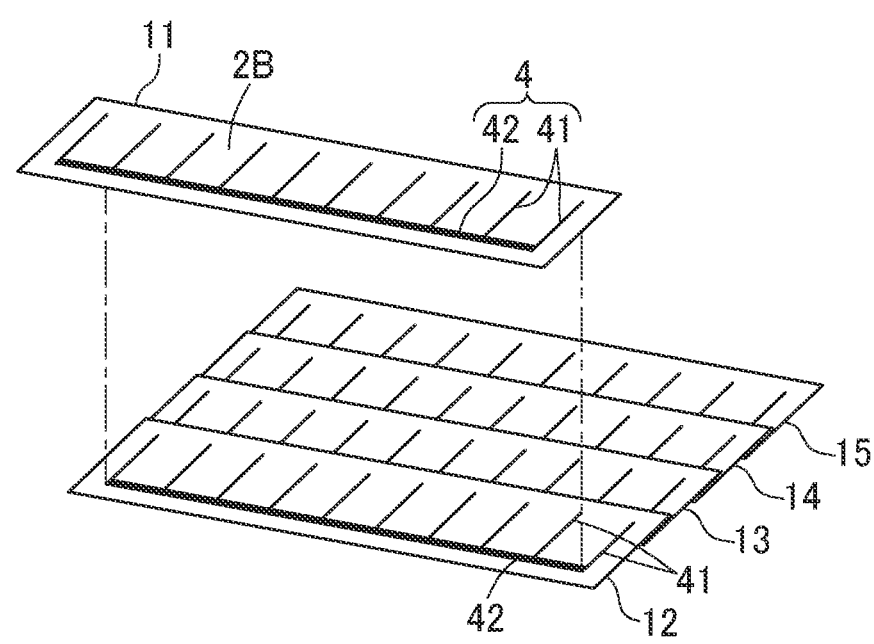
FIG. 4A is a perspective view showing a state immediately before overlapping the last one of the five small cell pieces.
Figure 5:
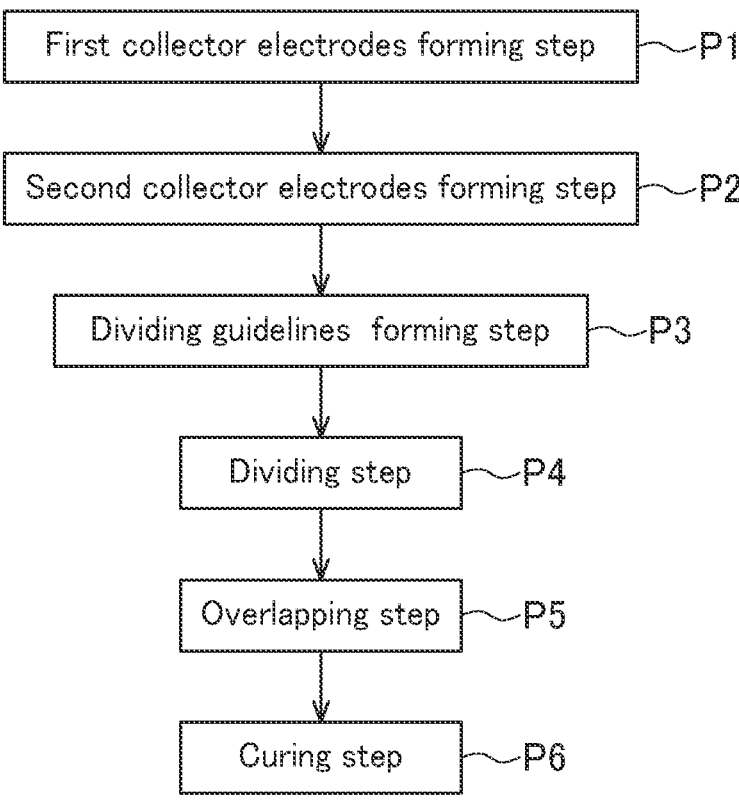
FIG. 5 is a block diagram of a method for connecting a solar cell string.

As shown in FIG. 5, the method for connecting the solar cell string includes: a first collector electrodes forming step P1 of forming the plurality of front-side collector electrodes 3 on the front surface 2A of the solar cell 1; a second collector electrodes forming step P2 of forming the plurality of back-side collector electrodes 4 by applying a pasty second collector electrode material including a metal component and a synthetic resin component to portions of the back surface 2B of the solar cell 1 so as to be opposed to respective ones of the first collector electrodes (while keeping the second collector electrode material in an uncured state after the application); and a dividing guidelines forming step P3 of forming a plurality of dividing guidelines R (see FIG. 3A) in the solar cell 1. The method for connecting the solar cell string further includes: a dividing step P4 of cutting the solar cell 1 along the plurality of dividing guidelines R to divide the solar cell 1 into the plurality of small cell pieces 11 to 15 each having the first collector electrode and the second collector electrode (see FIG. 3B); an overlapping step P5 of overlapping a plurality of small cell pieces 12 and 11 (see FIG. 4A) on each other out of the plurality of divided small cell pieces 11 to 15 so as to bring the front-side bus bar electrode 32 of the front-side collector electrode 3 of one small cell piece 12 and the back-side bus bar electrode 42 of the back-side collector electrode 4 of the other small cell piece 11 into abutting contact with each other; and a curing step P6 of curing the pasty back-side collector electrode 4 after overlapping the plurality of small cell pieces 12 and 11. In the dividing guidelines forming step P3, each of the plurality of dividing guidelines R is formed to allow the solar cell 1 to be easily divided into the plurality of small cell pieces 11 to 15, and is formed between each two adjacent ones of the plurality of first collector electrodes 3 formed on the front surface 2A and between each two adjacent ones of the plurality of second collector electrodes 4 formed on the back surface 2B. This configuration eliminates the necessity of disposing conductive members different from the collector electrodes 3 or 4 between the front-side collector electrodes 3 and the back-side collector electrodes 4, thus achieving excellent productivity. Further, the configuration that the solar cell on which the plurality of front-side collector electrodes 3 and the back-side collector electrodes 4 are formed is divided into the plurality of small cell pieces achieves more excellent productivity than the configuration that the solar cell is divided into the plurality of small cell pieces, and thereafter the front-side collector electrodes 3 and the back-side collector electrodes 4 are formed on the respective ones of these small cell pieces.

The first collector electrodes forming step P1 includes a step of forming the front-side bus bar electrode 32 of the front-side collector electrode 3 on a front surface of each of the small cell pieces 11 to 15 to be divided, so as to be positioned close to the one side 2d out of the pair of sides 2c and 2d of the solar cell 1 opposed to each other. Further, the second collector electrodes forming step P2 includes a step of forming the back-side bus bar electrode 42 of the back-side collector electrode 4 on a back surface of each of the plurality of small cell pieces 11 to 15, so as to be positioned close to the other side 2c out of the pair of sides 2c and 2d. The overlapping step P5 is a step of bringing the front-side bus bar electrodes 32 of the front-side collector electrodes 3 and the bus bar electrodes 42 of the back-side collector electrodes 4 into overlapping each other.

A description will be given on the steps of the method for connecting the solar cell string. First, the semiconductor substrate 2 shown in FIG. 1A is prepared, and the front-side finger electrodes 31 and the front-side bus bar electrodes 32 are formed on the respective segments obtained by dividing the font side of the semiconductor substrate 2 into five equal parts in the right-left direction. The front-side finger electrodes 31 and the front-side bus bar electrodes 32 are formed by applying a conductive metal paste in a desired shape by, for example, screen printing, followed by being baked in a furnace for curing. The metal paste for the front-side finger electrodes 31 and the metal paste for the front-side bus bar electrodes 32 can be made of different materials or the same material.

Next, as shown in FIG. 2A, the semiconductor substrate 2 is turned upside down so that the back surface 2B of the semiconductor substrate 2 faces upward. Then, as shown in FIG. 2B, the back-side finger electrodes 41 and the back-side bus bar electrodes 42 are formed on the respective segments obtained by dividing the back surface 2B of the semiconductor substrate 2 into five equal parts in the right-left direction, in the same manner as for the front surface. In so doing, there is difference in that each of the front-side bus bar electrodes 32 is formed at a position close to the one side 2d (i.e., the right side 2d) of the semiconductor substrate 2 whereas each of the back-side bus bar electrodes 42 is formed at a position close to the other side 2c (i.e., the left side 2c) of the semiconductor substrate 2. That is, the front-side bus bar electrode 32 and the back-side bus bar electrode 42 are formed respectively at one end (right end 2d) and the other end (left end 2c) in the right-left direction within each of the segments, and are formed at positions not overlapping each other in plan view of the semiconductor substrate 2.

The back-side finger electrodes 41 and the back-side bus bar electrodes 42 are formed by just applying the conductive metal paste into a desired shape by, for example, screen printing. The metal paste after the application is left uncured (not subjected to curing treatment). The material of the metal paste (second collector electrode material) includes a metal component composed mainly of a metal such as silver, and a synthetic resin component including a synthetic resin. In this embodiment, the synthetic resin component includes, as the main component, a thermosetting resin such as a thermosetting acrylic resin or a silicone resin. This synthetic resin component can include an acrylic-based, epoxy-based, or urethane-based ultraviolet curable resin as the main component, or a thermoplastic resin as the main component. When a thermoplastic resin is used as the synthetic resin component, it is heated to a temperature at which the thermoplastic resin is softened, and temperature control is made to prevent the thermoplastic resin from being solidified until the front-side bus bar electrodes 32 and the back-side bus bar electrodes 42 are connected to each other. When the synthetic resin component includes a thermosetting resin such as a thermosetting acrylic resin or a silicone resin as the main component, the second collector electrode material after being cured still has large elasticity, and can thus favorably absorb external force.

Figure 3A:
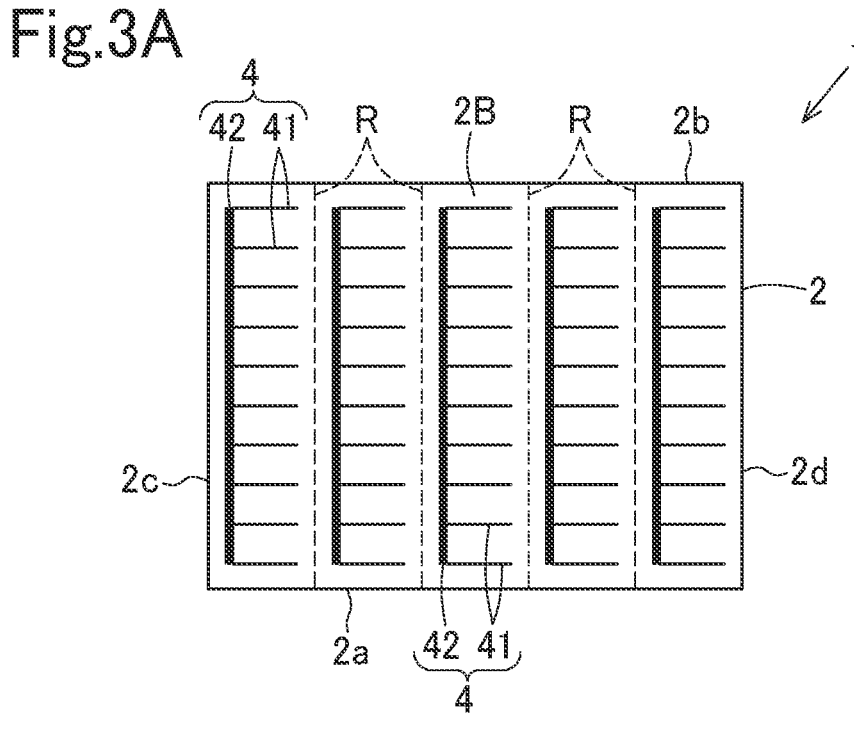
FIG. 3A is a bottom view of the solar cell of FIG. 2B with the other surface having scribe lines formed thereon.
Figure 3B:
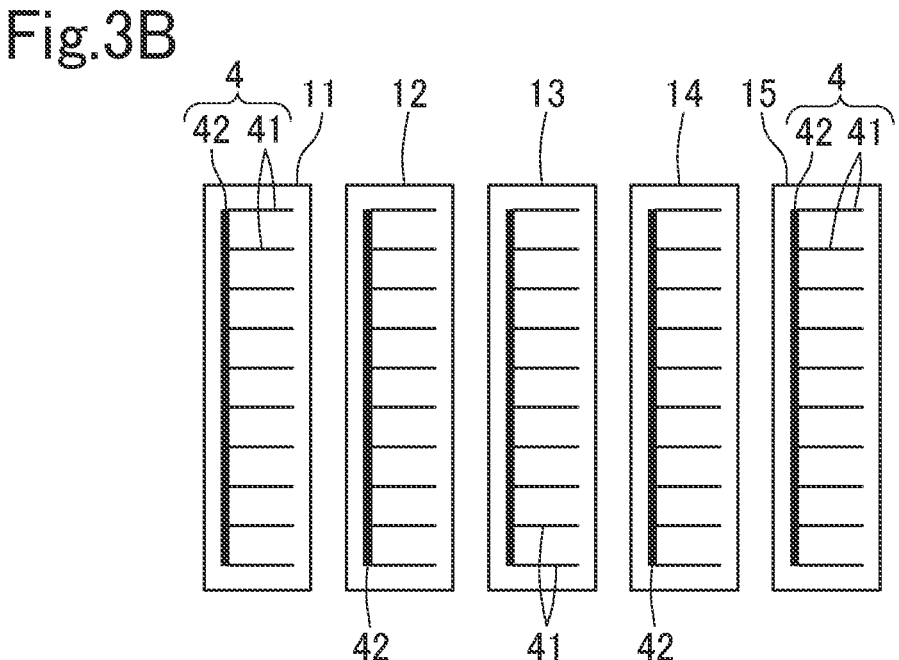
FIG. 3B is a bottom view of five small pieces obtained by cutting the solar cell along the scribe lines of FIG. 3A.

When the formation of the back-side collector electrodes 4 is completed, the dividing guidelines R for dividing the semiconductor substrate 2 into the five segments are formed, as shown in FIG. 3A, by irradiating the semiconductor substrate 2 with laser beam. The semiconductor substrate 2 is thus repeatedly irradiated with laser beam to be thereby capable of being cut into the five small cell pieces 11 to 15 (see FIG. 3B). The dividing guidelines are linear grooves substantially parallel to the left and right sides 2c, 2d of the semiconductor substrate 2. In this embodiment, the semiconductor substrate 2 is cut by laser beam, but the configuration can be such that the dividing guidelines R are formed on the semiconductor substrate 2 by laser beam, and the semiconductor substrate 2 is cut along the dividing guidelines R using, for example, a diamond cutter.

Figure 4B:
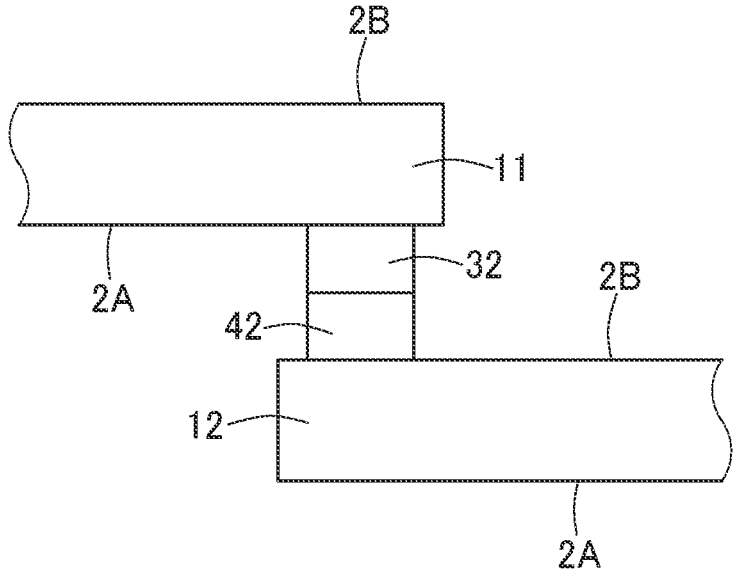
FIG. 4B is an enlarged view of an essential part of FIG. 4A showing a part where the collector electrodes are connected to each other.

While the five small cell pieces 11 to 15 have their back surfaces directed upward, the small cell piece 11 on the upper side is placed on the small cell piece 12 on the lower side in a shingling manner so that the front-side bus bar electrode (see FIG. 4B) 32 directed downward and positioned at the right end of the front surface 2A of the small cell piece 11 on the upper side overlaps the back-side bus bar electrode 42 directed upward and positioned at the left end of the back surface 2B of the small cell piece 12 on the lower side as shown in FIGS. 4A and 4B. In so doing, the back-side bus bar electrode 42 being not cured (i.e., having elasticity) is likely to closely adhere to the cured front-side bus bar electrode 32. After the overlapping of all the five small cell pieces is completed, these small cell pieces 11 to 15 are fired in a firing furnace so that the back-side finger electrodes 41 and the back-side bus bar electrodes 42 are cured to allow the small cell pieces 11 to 15 to be electrically connected to each other in series (this connection is called shingling connection). After the connection, the connected small cell pieces 11 to 15 are disposed between a front-side protective material and a back-side protective material, and sealed with a sealing resin to thereby complete the solar cell string 5. The solar cell string 5 thus configured to have the plurality of small cell pieces 11 to 15 connected to each other can increase output per unit area. Since, in this embodiment, the uncured back-side bus bar electrodes 42 are placed to be directed upward for connection, the back-side bus bar electrodes 42 are suppressed from being deformed so as to drip down, which occurs when the back-side bus bar electrodes 42 are placed to be directed downward for connection.

Figure 6:
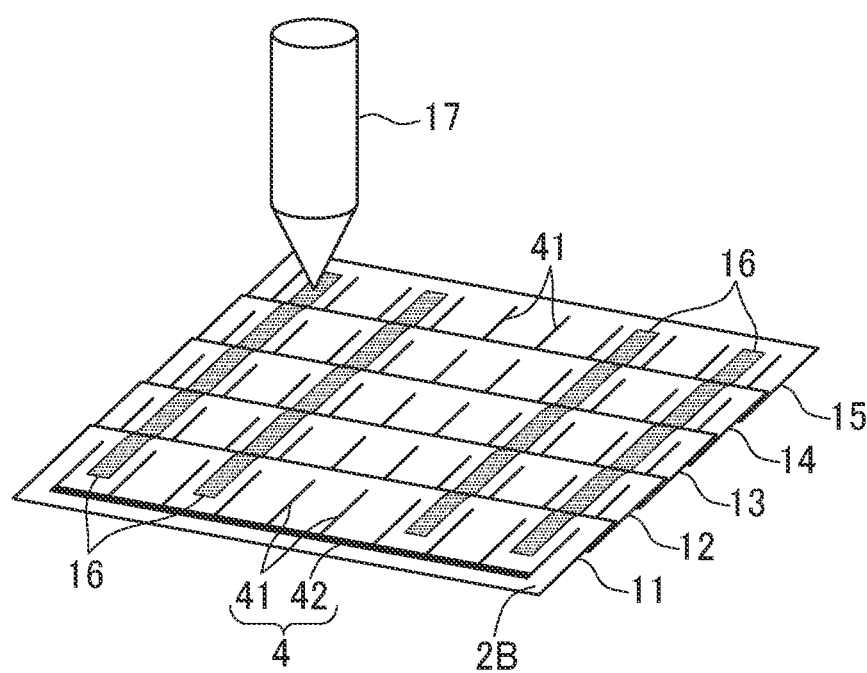
FIG. 6 is a perspective view of another embodiment, the view showing a state where a transparent resin is disposed in a tape shape using a dispenser on an upper surface of a solar cell string formed of five overlapped small cell pieces.

The present invention further includes a step (not shown) of attaching a transparent synthetic resin to the plurality of overlapping small cell pieces 11 to 15 before curing the second collector electrode material, so as to extend over these small cell pieces. Specifically, as shown in FIG. 6, the configuration can be such that a transparent synthetic resin (thermosetting resin) 16 is attached in a tape shape (or a thread shape) to the back surfaces 2B of the small cell pieces 11 to 15 using, for example, a dispenser 17 so as to extend over all the small cell pieces 11 to 15 after the overlapping of all the five small cell pieces 11 to 15 is completed and before curing the back-side collector electrodes 4. Thereafter, the small cell pieces 11 to 15 are fired in a firing furnace to cause the synthetic resin (thermosetting resin) 16 to be thermally cured for reinforced connection between the small cell pieces, which is preferable. In FIG. 6, the synthetic resin is attached to four locations, but the configuration can be such that the synthetic resin is attached to only one location, or two, three, or five or more given number of locations.

It is a matter of course that the present invention is not limited to the aforementioned embodiment, but various modifications can be made without departing from the gist of the present invention.

The aforementioned embodiment has been described by taking, for example, the case where both the back-side finger electrodes 41 and the back-side bus bar electrodes 42 of the back-side collector electrodes 4 are left uncured after being applied, but the configuration can be such that the back-side finger electrodes 41 are subjected to curing treatment and only the back-side bus bar electrodes 42 are left uncured.

According to the present invention, the configuration that the first collector electrodes and the second collector electrodes are directly connected to each other can provide a method for connecting a solar cell string excellent in productivity and a solar cell string obtained by the connecting method.

A method for connecting a solar cell string according to the present invention includes: a first collector electrodes forming step of forming a plurality of first collector electrodes on one surface of a solar cell; a second collector electrodes forming step of forming a plurality of second collector electrodes by applying a pasty second collector electrode material including a metal component and a synthetic resin component to portions of an other surface of the solar cell so as to be opposed to the respective ones of the plurality of first collector electrodes; a dividing guidelines forming step of forming a plurality of dividing guidelines on the solar cell to allow the solar cell to be easily divided into a plurality of small cell pieces, in which each of the plurality of dividing guidelines is formed between each two adjacent ones of the plurality of first collector electrodes formed on the one surface and between each two adjacent ones of the plurality of second collector electrodes formed on the other surface; a dividing step of cutting the solar cell along the plurality of dividing guidelines to divide the solar cell into the plurality of small cell pieces each having each of the plurality of first collector electrodes and each of the plurality of the second collector electrodes; an overlapping step of overlapping the plurality of small cell pieces so as to bring the first collector electrode of one of the plurality of small cell pieces and the second collector electrode of another one of the plurality of small cell pieces into abutting contact with each other; and a curing step of curing the pasty second collector electrode material after the plurality of small cell pieces are made to overlap.

According to such a configuration, the first collector electrode and the second collector electrode are electrically connected to each other simply by allowing the plurality of small cell pieces to overlap each other so as to bring the first collector electrode of the one of the plurality of small cell pieces and the second collector electrode of the other one of the plurality of small cell pieces into overlapping each other, followed by curing the second collector electrode. This configuration eliminates the necessity of disposing a different conductive member from the first or second collector electrode between the first collector electrode and the second collector electrode, thus achieving excellent productivity.

Further, the configuration that the solar cell having the plurality of first collector electrodes and the plurality of second collector electrodes formed thereon is divided into the plurality of small cell pieces is more excellent in productivity than the configuration that the solar cell is divided into the plurality of small cell pieces, and thereafter the first collector electrodes and the second collector electrodes are formed on the respective ones of the plurality of small cell pieces.

The method for connecting the solar cell string can be configured such that the solar cell has a substantially quadrangular shape, the plurality of dividing guidelines are grooves substantially parallel to a pair of opposed sides of the solar cell, the plurality of first collector electrodes and the plurality of second collector electrodes each include a bus bar electrode, the first collector electrodes forming step includes a step of forming the bus bar electrode of each of the plurality of first collector electrodes at a position close to one of the pair of opposed sides of one surface of each of the plurality of small cell pieces to be divided, the second collector electrodes forming step includes a step of forming the bus bar electrode of each of the plurality of second collector electrodes at a position close to another one of the pair of opposed sides of an other surface of each of the plurality of small cell pieces, and the overlapping step is a step of bringing the bus bar electrode of each of the plurality of first collector electrodes and the bus bar electrode of each of the plurality of second collector electrodes into overlapping each other.

The above configuration that the bus bar electrode of the second collector electrode formed at a position close to the other side of the other surface and the bus bar electrode of the first collector electrode formed at a position close to the one side of the one surface are connected to each other, i.e., connected by shingling, can increase the power per unit area of the solar cell string formed of the plurality of small cell pieces connected to each other.

The method for connecting the solar cell string can be configured such that the synthetic resin component of the second collector electrode material includes, as a main component, an acrylic resin or a silicone resin.

The above configuration that the acrylic resin or the silicone resin is used as the main component increases the elasticity of the second collector electrode material even after being cured, thus being capable of favorably absorbing external force.

The method for connecting the solar cell string can further include a step of attaching a transparent synthetic resin to the plurality of overlapped small cell pieces so as to extend over the plurality of small cell pieces, before curing the second collector electrode material.

The above configuration that the transparent synthetic resin is attached to the plurality of overlapped small cell pieces so as to extend over the plurality of small cell pieces can reinforce the connection of the small cell pieces.

REFERENCE SIGNS LIST

1: Solar cell
2: Semiconductor substrate
2A: Front surface (one surface)
2B: Back surface
2*a*, 2*b*, 2*c*, 2*d*: Side
3: Front-side collector electrode (first collector electrode)
4: Back-side collector electrode (second collector electrode)
5: Solar cell string 11 to 15: Small cell pieces
16: Synthetic resin (thermosetting resin)
17: Dispenser
31: Front-side finger electrode
32: Front-side bus bar electrode
41: Back-side finger electrode
42: Back-side bus bar electrode
P1: First collector electrodes forming step
P2: Second collector electrodes forming step
P3: Dividing guidelines forming step
P4: Dividing step
P5: Overlapping step
P6: Curing step
R: Dividing guideline (scribe line)

The invention claimed is:

1. A method for connecting a solar cell string, the method comprising:

forming a plurality of first collector electrodes on one surface of a solar cell;

forming a plurality of second collector electrodes by applying a pasty second collector electrode material comprising a metal component and a synthetic resin component to portions of an other surface of the solar cell so as to be opposed to the respective ones of the plurality of first collector electrodes, wherein the plurality of first collector electrodes and the plurality of second collector electrodes each comprise a bus bar electrode;

forming a plurality of dividing guidelines on the solar cell to allow the solar cell to be easily divided into a plurality of small cell pieces, wherein each of the plurality of dividing guidelines is formed between each two adjacent ones of the plurality of first collector electrodes formed on the one surface and between each two adjacent ones of the plurality of second collector electrodes formed on the other surface;

cutting the solar cell along the plurality of dividing guidelines to divide the solar cell into the plurality of small cell pieces each having each of the plurality of first collector electrodes and each of the plurality of the second collector electrodes;

overlapping the plurality of small cell pieces so as to bring the bus bar electrode of each of the plurality of first collector electrodes and the bus bar electrode of each of the plurality of second collector electrodes into overlapping each other; and curing the pasty second collector electrode material after the plurality of small cell pieces are made to overlap.

2. The method for connecting the solar cell string according to claim 1, wherein the solar cell has a substantially quadrangular shape, the plurality of dividing guidelines are grooves substantially parallel to a pair of opposed sides of the solar cell, forming the plurality of first collector electrodes comprises forming the bus bar electrode of each of the plurality of first collector electrodes on the one surface of the solar cell at a position close to one edge of a pair of opposed edges of each of the plurality of small cell pieces upon cutting the solar cell along the plurality of dividing guidelines, and forming the plurality of second collector electrodes comprises forming the bus bar electrode of each of the plurality of second collector electrodes on the other surface of the solar cell at a position close to another edge the pair of opposed edges of each of the plurality of small cell pieces.

3. The method for connecting the solar cell string according to claim 1, wherein the synthetic resin component of the second collector electrode material comprises an acrylic resin or a silicone resin.

4. The method for connecting the solar cell string according to claim 1, the method further comprising a step of attaching a transparent synthetic resin to the plurality of overlapped small cell pieces so as to extend over the plurality of small cell pieces, before curing the second collector electrode material.

5. The method for connecting the solar cell string according to claim 2, wherein the synthetic resin component of the second collector electrode material comprises an acrylic resin or a silicone resin.

6. The method for connecting the solar cell string according to claim 2, the method further comprising attaching a transparent synthetic resin to the plurality of overlapped small cell pieces so as to extend over the plurality of small cell pieces, before curing the second collector electrode material.

7. The method for connecting the solar cell string according to claim 3, the method further comprising attaching a transparent synthetic resin to the plurality of overlapped small cell pieces so as to extend over the plurality of small cell pieces, before curing the second collector electrode material.

* * * * *